US006881636B2

(12) United States Patent
Weimer et al.

(10) Patent No.: US 6,881,636 B2
(45) Date of Patent: Apr. 19, 2005

(54) METHODS OF FORMING DEUTERATED SILICON NITRIDE-CONTAINING MATERIALS

(75) Inventors: Ronald A. Weimer, Boise, ID (US); Lyle D. Breiner, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 19 days.

(21) Appl. No.: 10/612,836

(22) Filed: Jul. 3, 2003

(65) Prior Publication Data

US 2005/0003680 A1 Jan. 6, 2005

(51) Int. Cl.$^7$ .............................................. H01L 21/318
(52) U.S. Cl. ................ 438/303; 438/786; 427/255.393
(58) Field of Search ................... 438/301, 303, 438/595, 786, 791; 427/255.29, 255.39, 255.393, 255.394

(56) References Cited

U.S. PATENT DOCUMENTS

| | | | | |
|---|---|---|---|---|
| 6,114,734 A | * | 9/2000 | Eklund | 257/410 |
| 6,271,125 B1 | * | 8/2001 | Yoo et al. | 438/637 |
| 6,444,533 B1 | * | 9/2002 | Lyding et al. | 438/308 |
| 6,521,977 B1 | * | 2/2003 | Burnham et al. | 257/649 |
| 2003/0222318 A1 | * | 12/2003 | Tanaka et al. | 257/406 |

OTHER PUBLICATIONS

Stanley Wolf and Richard N. Tauber, "Silicon Processing for the VLSI Era—vol. 1: Process Technology," Lattice Press, Sunset Beach, California, 1986, pp. 5–6.*

*Improved Hot–Electron Reliability in High–Performance, Multilevel–Metal CMOS Using Deuterated Barrier–Nitride Processing*; W.F. Clark et al; IEEE Electron Device Letters, vol. 20, No. 10, pp. 501–503, Oct. 1999.

*Realization of High Performance Dual Gate DRAMs without Boron Penetration by Application of Tetrachlorosilance Silicon Nitride Films*; Masayuki Tanaka et al.; 2001 Symposium VLSI Technology Digest of Technical Papers, pps. 123–124.

* cited by examiner

Primary Examiner—Stephen W. Smoot
(74) Attorney, Agent, or Firm—Wells St. John P.S.

(57) ABSTRACT

The invention includes methods of forming deuterated silicon nitride-containing materials from at least one deuterated nitrogen compound in combination with one or more silicon-containing compounds that do not contain hydrogen isotopes. Suitable deuterated nitrogen compounds can comprise, for example, $NH_2D$, $NHD_2$ and $ND_3$. Suitable silicon-containing compounds include, for example, $SiCl_4$ and $Si_2Cl_6$. Deuterated silicon nitride-containing materials of the present invention can be incorporated into, for example, transistor devices. The transistor devices can be utilized in DRAM cells, which in turn can be utilized in electronic systems.

12 Claims, 5 Drawing Sheets

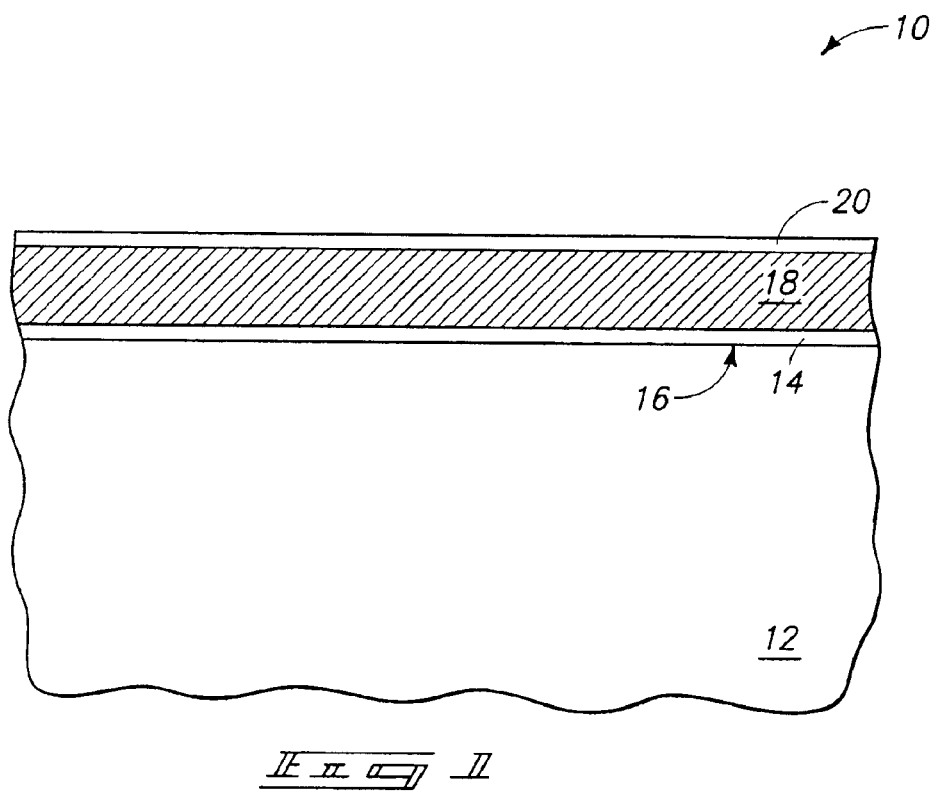
_Fig. 1_
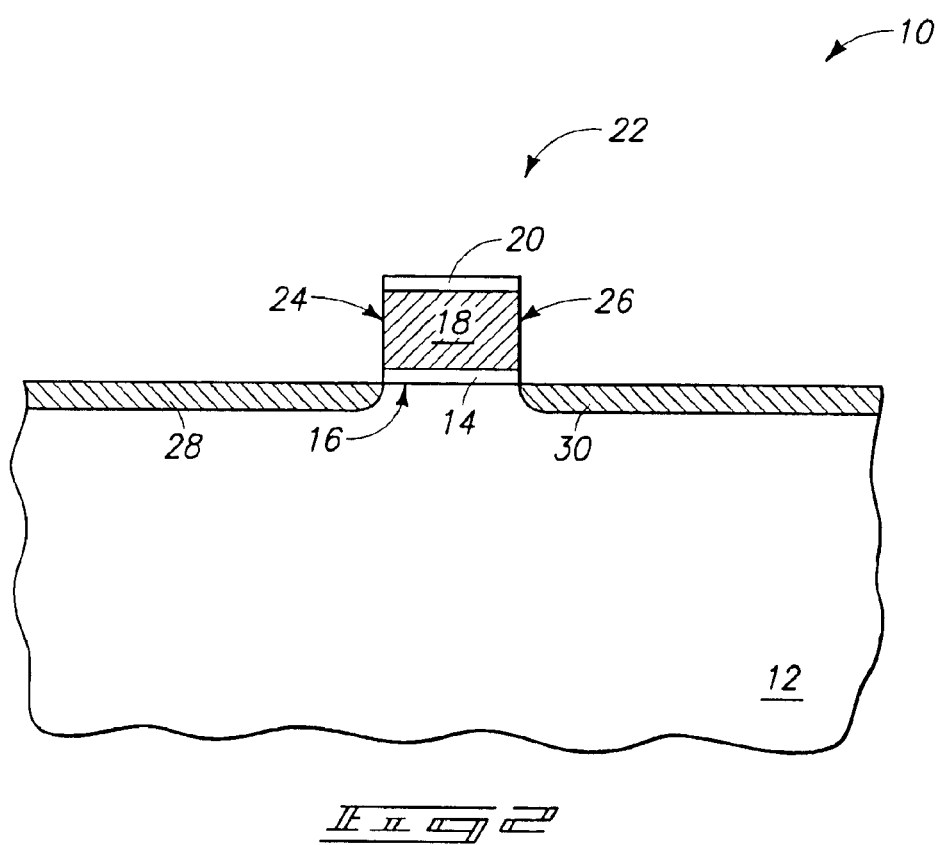
_Fig. 2_

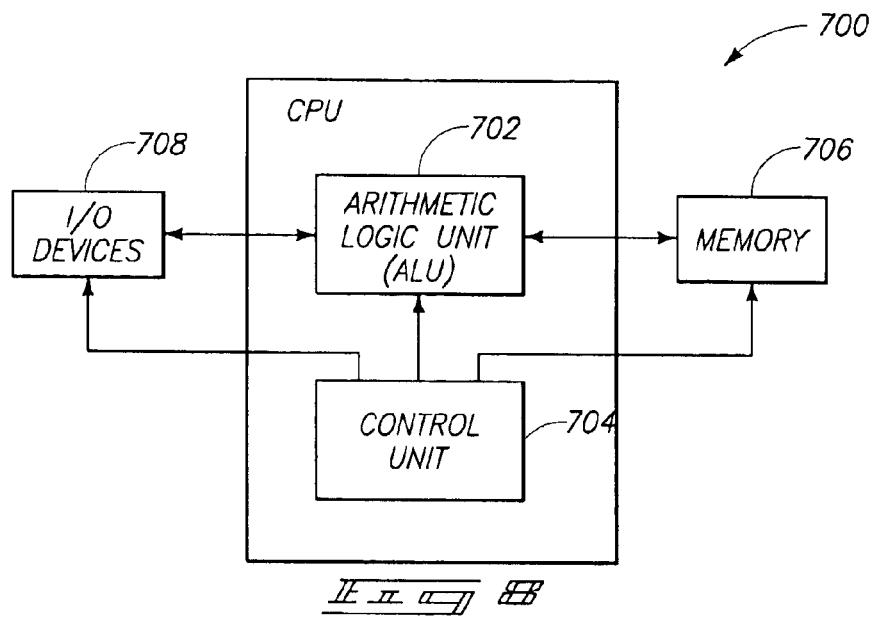
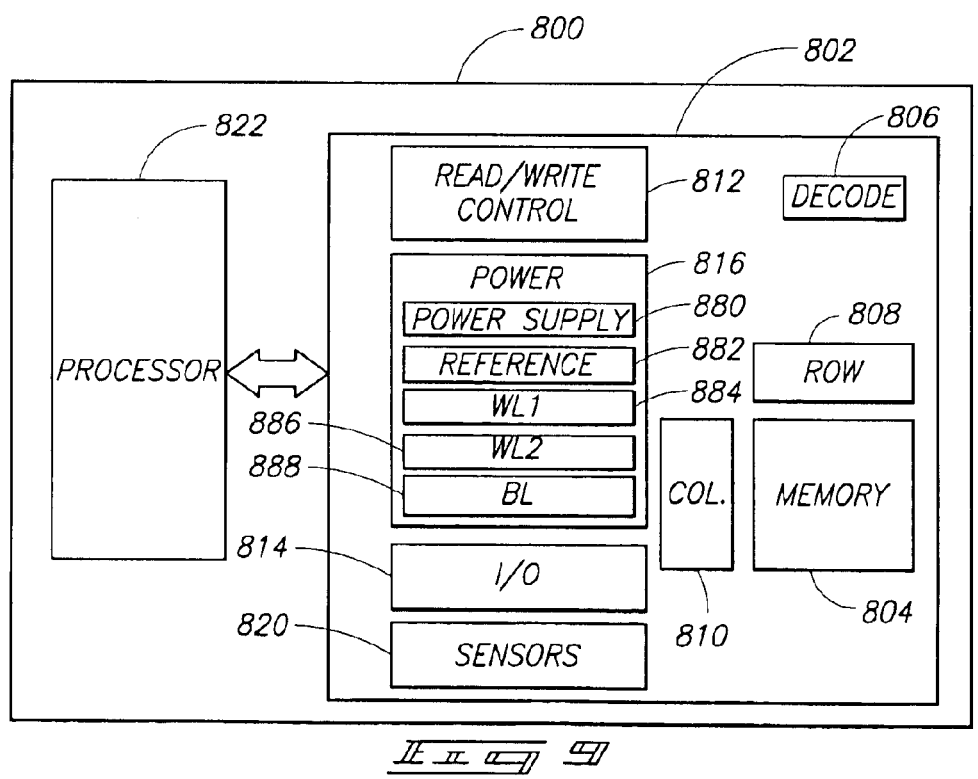

US 6,881,636 B2

METHODS OF FORMING DEUTERATED SILICON NITRIDE-CONTAINING MATERIALS

TECHNICAL FIELD

The invention pertains to methods of forming deuterated silicon nitride-containing materials.

BACKGROUND OF THE INVENTION

There are numerous uses for deuterated silicon nitride-containing materials in semiconductor processing. For instance, deuterated silicon nitride-containing materials can be utilized as reservoirs of deuterium during hardening of a silicon/silicon dioxide interface, as described in, for example, Clark, W. F. et al., "Improved Hot-Electron Reliability In High-Performance, Multilevel-Metal CMOS Using Deuterated Barrier-Nitride Processing", IEEE Electron Device Letters, Vol. 20, No. 10, pp. 501–503, October 1999.

Various methods have been proposed for forming deuterated silicon nitride-containing materials. The methods utilize a deuterated silicon-containing precursor (such as, for example, $SiD_4$) in combination with a nitrogen-containing precursor which may or may not be deuterated (with an exemplary non-deuterated nitrogen-containing precursor being $NH_3$, and an exemplary deuterated nitrogen-containing precursor being $ND_3$).

The methods described above for forming deuterated silicon nitride-containing materials tend to be relatively expensive, and accordingly it is desired to develop more economical methods for forming deuterated silicon nitride-containing materials.

SUMMARY OF THE INVENTION

In one aspect, the invention pertains to a method of forming a deuterated silicon nitride-containing material from at least one deuterated nitrogen compound and one or more silicon-containing compounds that do not contain hydrogen isotopes (i.e., do not contain hydrogen, deuterium or tritium). The silicon-containing compounds can be, for example, halogenated silicon compounds selected from the group consisting of $SiCl_4$, $Si_2Cl_6$ and mixtures thereof; and the at least one deuterated nitrogen compound can be, for example, selected from the group consisting of $NH_2D$, $NHD_2$, $ND_3$, and mixtures thereof.

In one aspect, the invention encompasses a method of forming a deuterated silicon nitride-containing material proximate an interface of silicon dioxide with non-oxidized silicon. A silicon dioxide-containing material is formed directly against a non-oxidized silicon surface. A deuterated silicon nitride-containing material is deposited over the silicon dioxide-containing material. The deposition of the deuterated silicon nitride-containing material utilizes at least one deuterated nitrogen compound and one or more halogenated silicon compounds that do not contain hydrogen isotopes.

In one aspect, the invention encompasses a method of forming electrically insulative sidewall liners along sidewalls of an electrically conductive line. The electrically conductive line is formed over a semiconductor substrate. The line comprises a pair of opposing sidewalls. A silicon nitride-containing material is formed along the sidewalls and over the semiconductor substrate utilizing a deposition from at least one deuterated nitrogen compound and one or more halogenated silicon compounds that do not contain hydrogen isotopes. The deuterated silicon nitride-containing material is anisotropically etched to form the sidewall liners along the sidewalls of the line.

BRIEF DESCRIPTION OF THE DRAWINGS

Preferred embodiments of the invention are described below with reference to the following accompanying drawings.

FIG. 1 is a diagrammatic, cross-sectional view of a semiconductor wafer fragment at a preliminary processing stage of an exemplary aspect of the present invention.

FIG. 2 is a view of the FIG. 1 wafer fragment shown at a processing stage subsequent to that of FIG. 1.

FIG. 8 is a high-level block diagram of an electronic system according to an exemplary aspect of the present invention.

FIG. 9 is a simplified block diagram of an exemplary electronic system according to an aspect of the present invention.

DETAILED DESCRIPTION OF THE PREFERRED EMBODIMENTS

Figure 3:
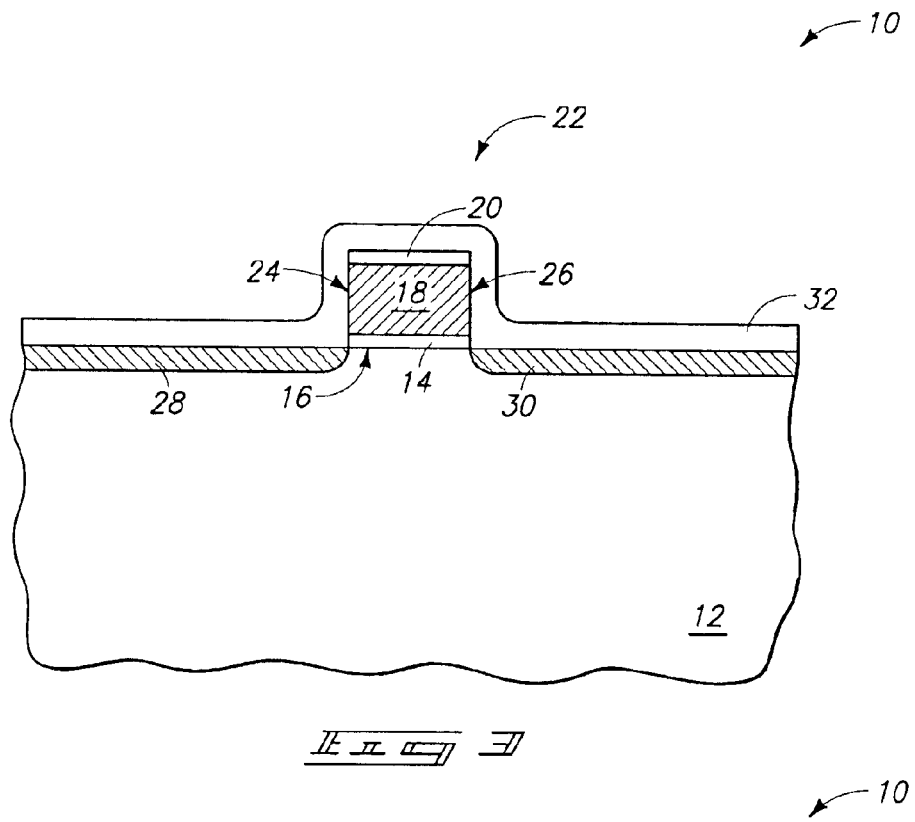
FIG. 3 is a view of the FIG. 1 wafer fragment shown at a processing stage subsequent to that of FIG. 2.

This disclosure of the invention is submitted in furtherance of the constitutional purposes of the U.S. Patent Laws "to promote the progress of science and useful arts" (Article 1, Section 8).

The invention pertains to methods of forming deuterated silicon nitride-containing materials. For purposes of interpreting this disclosure and the claims that follow, it is to be understood that the term "silicon nitride-containing material" includes any material comprising silicon and nitrogen, including, for example, materials consisting essentially of, or consisting of silicon nitride ($Si_xN_y$, where x and y are numbers greater than 0, and where x and y are typically 3 and 4, respectively), and materials comprising, consisting essentially of, or consisting of silicon oxynitride ($Si_xN_yO_z$, where x, y and z are numbers greater than 0). Accordingly, the term "deuterated silicon nitride-containing material" encompasses deuterated silicon oxynitride-containing materials.

One aspect of the invention is a recognition that a significant expense associated with prior art processes utilized for forming silicon nitride-containing materials is due to the utilization of deuterated silicon-containing compounds as precursors for formation of the deuterated silicon nitride-containing materials. Accordingly, the invention includes methodology by which deuterated silicon nitride-containing materials can be formed without utilization of deuterated silicon-containing precursors. Instead, the invention utilizes deuterated nitrogen-containing precursors in combination with silicon-containing precursors having no hydrogen or isotopes thereof. Exemplary silicon-containing precursors are halogenated silicon compounds that do not contain hydrogen isotopes, such as, for example, compounds consisting of silicon and chlorine. Specific silicon-containing compounds suitable for utilization as precursors of deuterated silicon nitride-containing materials in accordance with exemplary aspects of the present invention are $SiCl_4$ and $Si_2Cl_6$.

Methodology of the present invention can be utilized for forming deuterated silicon nitride-containing materials in any applications in which such materials are desired. Exemplary aspects of the present invention are described with reference to FIGS. 1–5 in which deuterated silicon nitride-containing materials are incorporated into a transistor device.

Referring initially to FIG. 1, a semiconductor construction 10 includes a substrate 12. Substrate 12 can comprise, for example, monocrystalline silicon lightly doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A layer 14 of electrically insulative material is formed over substrate 12, and is shown formed directly against an upper surface of substrate 12. Layer 14 can, for example, comprise, consist essentially of, or consist of silicon dioxide, and can be referred to as a pad layer or a pad oxide layer.

If layer 14 comprises silicon dioxide, the layer can be formed by deposition of silicon dioxide over substrate 12 (such as, for example, chemical vapor deposition) or by growth of silicon dioxide from silicon of substrate 12 by exposure of a surface of substrate 12 to appropriate oxidizing conditions.

An interface 16 occurs where insulative layer 14 joins to substrate 12. In particular applications, insulative layer 14 will comprise silicon dioxide, substrate 12 will comprise non-oxidized silicon, and interface 16 will thus comprise an interface where silicon dioxide contacts non-oxidized silicon.

Although insulative material 14 is shown as a single homogeneous layer, it is to be understood that the insulative material can comprise multiple layers of electrically insulative compositions in various aspects of the invention.

An electrically conductive material 18 is formed over insulative material 14. Electrically conductive material 18 can comprise any suitable conductive composition, including, for example, metals, metal compounds and conductively-doped silicon. In particular aspects, conductive material 18 will comprise p-type doped silicon, and will ultimately be incorporated as a gate for a PMOS field effect transistor. In other aspects, conductive material 18 will comprise n-type doped silicon. Although conductive material 18 is shown as a single homogeneous layer, it is to be understood that conductive material 18 can comprise multiple layers of differing electrically conductive compositions in various aspects of the invention.

An electrically insulative material 20 is formed over conductive material 18, and in the shown embodiment is formed directly against conductive material 18. Electrically insulative material 20 can comprise any suitable material, including, for example, one or more of silicon dioxide, silicon nitride, and silicon oxynitride. In particular aspects of the invention, insulative material 20 comprises a deuterated silicon nitride-containing material, and in such aspects material 20 can comprise, consist essentially of, or consist of for example, one or both of deuterated silicon nitride and deuterated silicon oxynitride.

If layer 20 comprises a deuterated silicon nitride-containing material, the layer can be formed by deposition from at least one deuterated nitrogen compound and one or more halogenated silicon compounds that do not contain hydrogen isotopes. The at least one deuterated nitrogen compound can be, for example, selected from the group consisting of $NH_2D$, $NHD_2$, $ND_3$, and mixtures thereof. The one or more halogenated silicon compounds can, for example, consist of silicon and chlorine, and in particular aspects can be selected from the group consisting of $SiCl_4$, $Si_2Cl_6$ and mixtures thereof. The deposition utilized to form the deuterated silicon nitride-containing material can be atomic layer deposition (ALD), chemical vapor deposition (CVD) or a mixture of ALD and CVD. In particular aspects, the deposition will be low pressure CVD (LPCVD). The LPCVD will be conducted within a reaction chamber, and will typically comprise a pressure of less than or equal to about 5 Torr within the chamber during the deposition. The LPCVD will typically be conducted while a temperature within the reaction chamber is maintained at from about 500° C. to about 850° C. A typical temperature utilized when the halogenated silicon compound consists essentially of, or consists of $Si_2Cl_6$ is from about 500° C. to about 700° C.; and a typical temperature utilized when the halogenated silicon compound consists essentially of, or consists of $SiCl_4$ is from about 600° C. to about 800° C.

The ratio of deuterated nitrogen compound to halogenated silicon compound within the reaction chamber during the chemical vapor deposition can be quantitated as a volume percentage of deuterated nitrogen compound relative to a volume percentage of halogenated silicon compound. Specifically, a total volume of the one or more deuterated nitrogen compounds provided in the chamber can be defined as a deuterated nitrogen compound volume, and a total volume of the one or more halogenated silicon compounds provided in the chamber can be defined as a halogenated silicon compound volume. The ratio of deuterated nitrogen precursor in the chamber relative to halogenated silicon precursor can be reported as a volume ratio of the deuterated nitrogen compound volume to the halogenated silicon compound volume. In particular aspects of the present invention, the volume ratio of the deuterated nitrogen compound volume to the halogenated silicon compound volume will be from about 1:1 to about 20:1 during CVD of deuterated silicon nitride-containing material, with an exemplary ratio being about 10:1. If the silicon nitride-containing material is to consist essentially of, or consist of silicon nitride, the only reactive components present in the reaction chamber during deposition of the silicon nitride-containing material can be the deuterated nitrogen compounds and the halogenated silicon compounds. If the deuterated silicon nitride-containing material is instead to be deuterated silicon oxynitride, an oxygen-containing precursor can be provided in the reaction chamber in addition to the deuterated nitrogen compounds and the halogenated silicon compounds. Suitable oxygen-containing precursors include, for example, oxygen ($O_2$) and ozone ($O_3$). In alternative processing, deuterated silicon oxynitride can be formed by exposing a material consisting essentially of, or consisting of deuterated silicon nitride to an oxidizing atmosphere after deposition of the material. Further, the oxygen content of a deuterated silicon oxynitride material can be, in particular aspects, increased by exposing the material to an oxidizing atmosphere.

Referring to FIG. 2, layers 14, 18 and 20 are patterned into a line 22. The line appears as a rectangular block in the cross-sectional view of FIG. 2, and it is to be understood that the line extends into and out of the page relative to the cross-sectional view of FIG. 2. Line 22 can ultimately be utilized as a wordline in a semiconductor construction. Line 22 has a pair of opposing sidewalls 24 and 26.

The patterning of line 22 can comprise, for example, formation of a patterned mask of photoresist (not shown) over a portion of materials 14, 18 and 20, a subsequent etch to remove segments of layers 14, 18 and 20 that are not protected by the mask, and subsequent removal of the mask. The photoresist mask can be formed utilizing photolithographic processing.

The portion of line 22 shown in the cross-sectional view of FIG. 2 can ultimately be incorporated into a gate of a transistor device. Accordingly, the stack of layers 14, 18 and 20 can be referred to as a gate stack. Although the shown processing patterns all of layers 14, 18 and 20 into a line shape in forming the gate stack, it is to be understood that the invention encompasses other aspects (not shown) in which pad layer 14 is not patterned into the line shape during formation of the gate stack.

The gate stack is utilized to align source/drain regions 28 and 30 which are formed proximate the gate stack. Regions 28 and 30 comprise conductively-doped diffusion regions extending into substrate 12. In particular aspects, regions 28 and 30 can be of appropriate dopant type to be incorporated into an n-type metal-oxide-semiconductor (NMOS) transistor device, and in other aspects regions 28 and 30 can have appropriate dopant type to be incorporated into a p-type metal-oxide-semiconductor (PMOS) device. The formation of source/drain regions 28 and 30 can be accomplished utilizing conventional processing. The invention can, in particular aspects, include steps in addition to those shown. For instance, a thin layer of oxide (not shown) can be formed along the sidewalls 24 and 26 of conductive material 18 prior to formation of source/drain regions 28 and 30.

Referring to FIG. 3, an electrically insulative material 32 is formed over line 22 and over substrate 12. Material 32 extends along sidewalls 24 and 26 of line 22. Insulative material 32 can comprise any suitable material, including, for example, one or more of silicon nitride, silicon dioxide and silicon oxynitride. In particular aspects, layer 32 will comprise, consist essentially of, or consist of one or more deuterated silicon nitride-containing materials. In such aspect, layer 32 can be formed by deposition from at least one deuterated nitrogen compound and one or more halogenated silicon compounds that do not contain hydrogen isotopes, utilizing processing described above relative to formation of deuterated silicon nitride-containing materials for layer 20.

Figure 4:
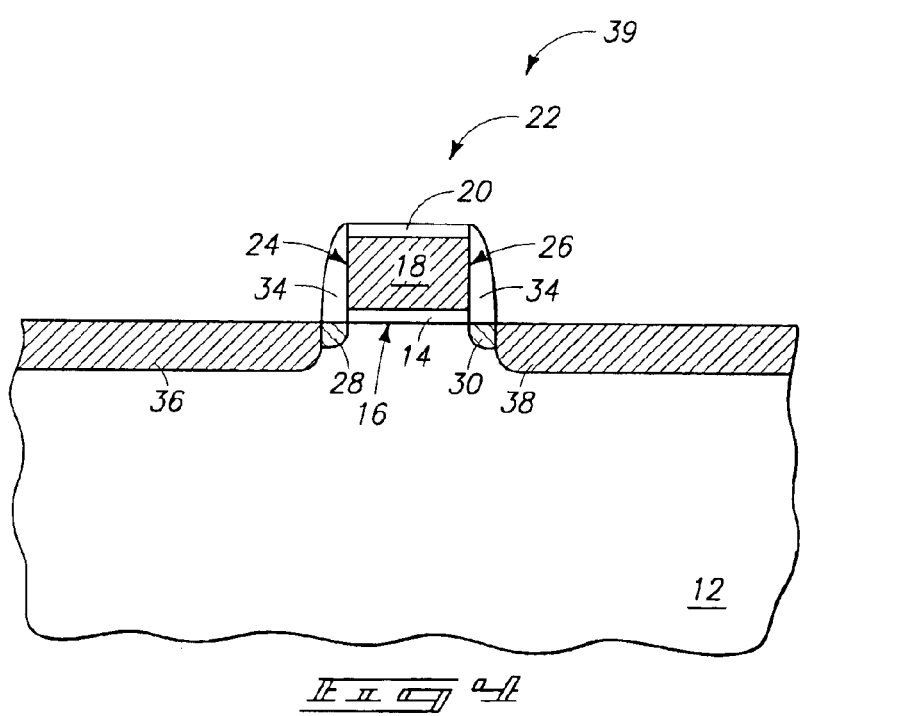
FIG. 4 is a view of the FIG. 1 wafer fragment shown at a processing stage subsequent to that of FIG. 3.

Referring to FIG. 4, layer 32 (FIG. 3) is anisotropically etched to form sidewall spacers (also referred to herein as sidewall liners) 34 along the sidewalls 24 and 26 of line 22.

After formation of sidewall spacers 34, conductivity-enhancing dopant is implanted into substrate 12 to form source/drain diffusion regions 36 and 38. The formation of regions 36 and 38 can be accomplished utilizing conventional methods, and the dopant utilized in region 36 and 38 can be suitable for formation of an NMOS transistor device in particular aspects of the invention, and a PMOS transistor device in other aspects of the invention. The source/drain regions 36 and 38 are gatedly connected to one another through the gate stack of line 22. Accordingly, the gate stack and source/drain regions together are incorporated into a transistor device 39.

Figure 5:
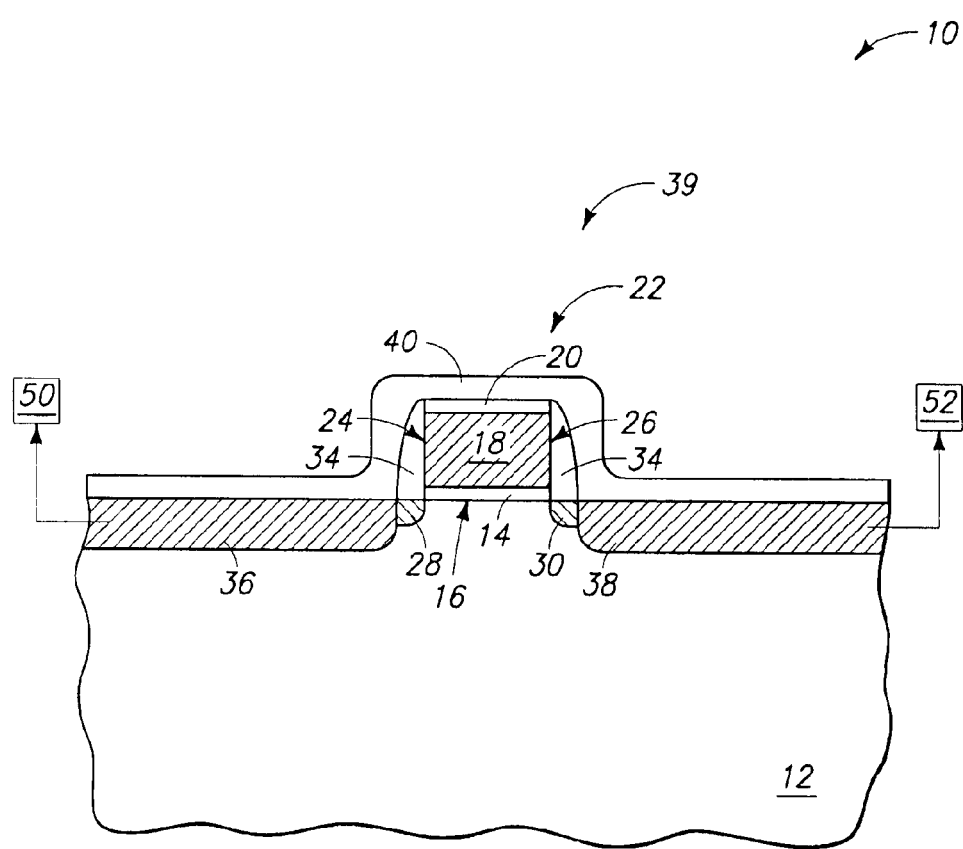
FIG. 5 is a view of the FIG. 1 wafer fragment shown at a processing stage subsequent to that of FIG. 4.

Referring to FIG. 5, an electrically insulative layer 40 is formed over line 22, spacers 34, and source/drain regions 36 and 38. Layer 40 can comprise any suitable electrically insulative material, and in particular aspects will comprise a deuterated silicon nitride-containing material. If layer 40 comprises a deuterated silicon nitride-containing material, the layer can be formed from at least one deuterated nitrogen compound and one or more halogenated silicon compounds that do not contain hydrogen isotopes, in processing of the type described previously for formation of a deuterated silicon nitride-containing material for layer 20. Barrier layer 40 can be referred to as a second deuterated silicon nitride-containing material, if layer 20 also comprises a deuterated silicon nitride-containing material, in order to distinguish the barrier layer from the material 20.

In accordance with the methodology discussed above, one or more of materials 34, 20 and 40 of the FIG. 5 construction can comprise deuterated silicon nitride-containing materials. Such materials can be beneficial in subsequent processing. For instance, if interface 16 is a silicon/silicon dioxide interface, deuterium from the deuterated materials can migrate to the silicon/silicon dioxide interface to harden the interface and reduce the susceptibility of such interface to hot-carrier degradation which could otherwise occur in thermal processing steps. An exemplary thermal processing step is a passivation anneal which can comprise heating substrate 12, and accordingly interface 16, to a temperature of from about 350° C. to about 450° C. for a time of from about 5 minutes to about 2 hours. The passivation anneal can comprise conventional processing, and accordingly can be conducted at atmospheric pressure, and while construction 10 is exposed to an ambient comprising about 10% (by volume) of hydrogen. The passivation anneal would frequently lead to hot-carrier degradation of a silicon/silicon dioxide interface 16 in the absence of deuterated materials proximate the interface. Methodology of the present invention can provide deuterated materials proximate the interface, and accordingly can alleviate, and even prevent the hot-carrier degradation.

In additional, and/or alternative aspects, conductive material 18 can comprise p-type doped silicon. In accordance with observations of Tanaka et al. (Tanaka, M. et al. "Realization Of High Performance Dual Gate DRAMs Without Boron Penetration By Application Of Tetrachlorosilane Silicon Nitride Films" 2001 Symposium on VLSI Technology Digest of Technical Papers, pp. 123 and 124), it can be advantageous to use SiH— less silicon nitride-containing films in PMOSFET constructions. Methodology of the present invention can be utilized to form the so-called SiH— less silicon nitride-containing films.

Although it is desirable to have at least one deuterated silicon nitride-containing material incorporated into construction 10, it is to be understood that various of the materials 20, 34 and 40 can comprise compositions other than deuterated silicon nitride-containing compositions, and/or can be omitted, if others of the layers 20, 34 and 40 comprise deuterated silicon nitride-containing compositions. For instance, if sidewall spacers 34 and/or cap 20 comprise deuterated silicon nitride-containing compositions, barrier layer 40 can be omitted in various aspects of the present invention.

Transistor device 39 can be incorporated into various semiconductor constructions. In an exemplary aspect of the invention, transistor device 39 can be incorporated into a DRAM construction. Specifically, one of the source/drain regions 36 and 38 can be electrically connected to a storage device and the other of the source/drain regions can be electrically connected to a bitline. In the FIG. 5 construction, source/drain region 36 is shown connected to a storage device 50 and source/drain region 38 is shown connected to a bitline 52. Storage device 50 can comprise, for example, a capacitor. The electrical connections to the source/drain regions 36 and 38 can be accomplished by any suitable method, including, for example, by extending electrically conductive interconnects (not shown) through layer 40 to connect with source/drain regions 36 and 38.

Among the improvements in transistor device characteristics that can be accomplished utilizing methodology of the present invention are, for example, hot electron resistance, reduced silicon-dielectric interface degradation, and DRAM refresh improvement.

Constructions formed in accordance with methodology of the present invention (such as the above-described wordlines and DRAM cells) can be utilized in numerous assemblies, including, for example, computer systems and other electronic systems.

Figure 6:
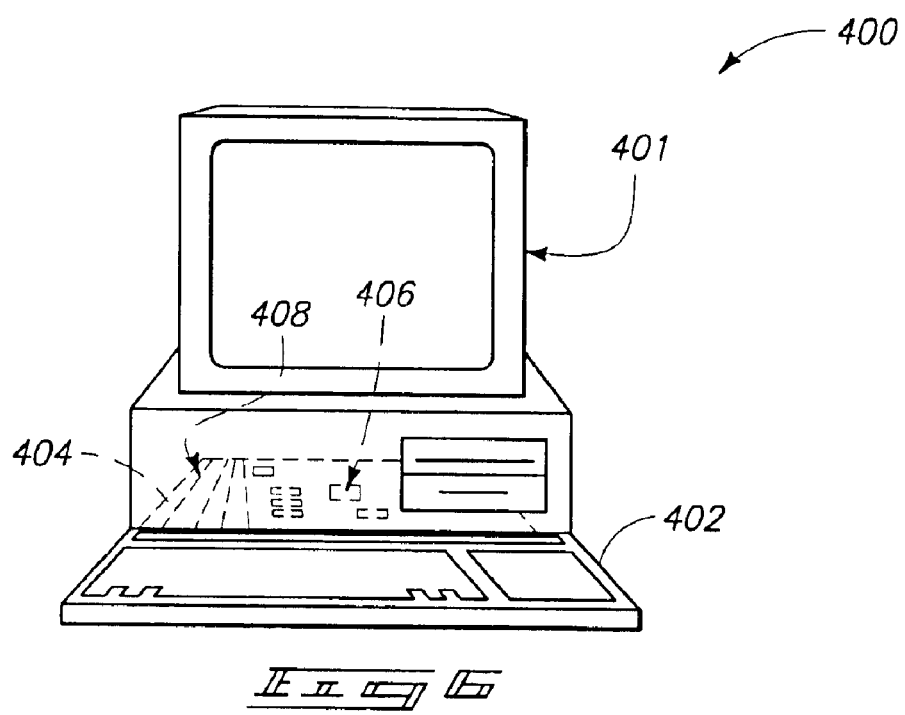
FIG. 6 is a diagrammatic view of a computer illustrating an exemplary application of the present invention.
Figure 7:
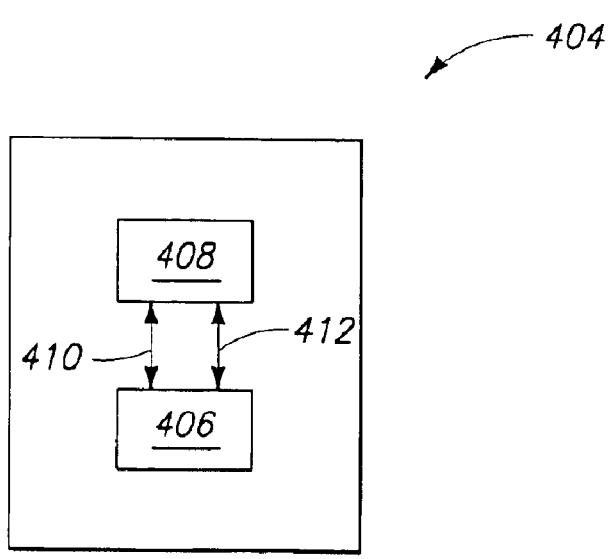
FIG. 7 is a block diagram showing particular features of the motherboard of the FIG. 6 computer.

FIG. 6 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above, including, for example, one or more of the wordlines and DRAM unit cells. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 7. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation which utilizes the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

FIG. 8 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells and wordlines in accordance with various aspects of the present invention.

FIG. 9 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a DRAM cell of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of ordinary skill in the art will understand that the various electronic systems can be fabricated in single-package processing units, or even on a single semiconductor chip, in order to reduce the communication time between the processor and the memory device (s).

Applications for memory cells and wordlines can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a transistor device, comprising:
forming a gate stack over a semiconductor substrate; the gate stack comprising an electrically insulative pad, at least one electrically conductive material over the pad, and an electrically insulative cap over the at least one electrically conductive material; the gate stack comprising a pair of opposing sidewalls extending at least along the one or more conductive materials and the cap;
forming an electrically insulative material along the sidewalls;
anisotropically etching the electrically insulative material to form sidewall spacers along the sidewalls;
implanting dopant into the substrate proximate the gate stack to form a pair of source/drain diffusion regions gatedly connected to one another through the gate stack; and
depositing a deuterated silicon nitride-containing material over the gate stack and over the sidewall spacers; the deuterated silicon nitride-containing material being deposited from at least one deuterated nitrogen compound and one or more halogenated silicon compounds that do not contain hydrogen isotopes; the deuterated silicon nitride-containing material being a deuterated silicon oxynitride-containing material.

2. The method of claim 1 wherein the electrically insulative material formed along the sidewalls and used to form the sidewall spacers is a deuterated silicon nitride-containing material deposited from at least one deuterated nitrogen compound and one or more halogenated silicon compounds that do not contain hydrogen isotopes.

3. The method of claim 1 wherein the electrically insulative cap is a deuterated silicon nitride-containing material deposited from at least one deuterated nitrogen compound and one or more halogenated silicon compounds that do not contain hydrogen isotopes.

4. The method of claim 3 wherein the electrically insulative material formed along the sidewalls and used to form the sidewall spacers is a deuterated silicon nitride-containing material deposited from at least one deuterated nitrogen compound and one or more halogenated silicon compounds that do not contain hydrogen isotopes.

5. The method of claim 1 wherein the depositing is chemical vapor deposition conducted at a pressure of less than or equal to about 5 Torr.

6. The method of claim 1 wherein the at least one deuterated nitrogen compound is selected from the group consisting of $NH_2D$, $NHD_2$, $ND_3$, and mixtures thereof.

7. The method of claim 1 wherein the one or more halogenated silicon compounds consist of silicon and chlorine.

8. The method of claim 7 wherein the one or more halogenated silicon compounds are selected from the group consisting of $SiCl_4$, $Si_2Cl_6$ and mixtures thereof.

9. The method of claim 8 wherein the at least one deuterated nitrogen compound is selected from the group consisting of $NH_2D$, $NHD_2$, $ND_3$, and mixtures thereof.

10. The method of claim 1 wherein a passivation anneal is conducted after forming the deuterated silicon oxynitride-containing material; the passivation anneal comprising heating the substrate to a temperature of from about 350° C. to about 450° C. for a time of from about 5 minutes to about 2 hours.

11. The method of claim 1 further comprising incorporating the transistor device into a DRAM cell.

12. The method of claim 11 further comprising incorporating the DRAM cell into an electronic system.

* * * * *